United States Patent [19]

Smith et al.

[11] Patent Number: 4,595,899
[45] Date of Patent: Jun. 17, 1986

[54] MAGNETIC STRUCTURE FOR NMR APPLICATIONS AND THE LIKE

[75] Inventors: Todd I. Smith; Michael S. McAshan, both of Palo Alto; William M. Fairbank, Menlo Park, all of Calif.

[73] Assignee: The Board of Trustees of the Leland Stanford Junior University, Stanford, Calif.

[21] Appl. No.: 713,098

[22] Filed: Mar. 18, 1985

Related U.S. Application Data

[63] Continuation of Ser. No. 628,452, Jul. 6, 1984.

[51] Int. Cl.$^4$ ............................................. H01F 7/22
[52] U.S. Cl. .................................. 335/216; 335/299; 324/320
[58] Field of Search .............. 335/209, 210, 216, 299; 324/318, 319, 320, 322

[56] References Cited

U.S. PATENT DOCUMENTS

| | | | |
|---|---|---|---|
| 2,179,257 | 11/1939 | Goldviznin | 336/205 |
| 2,265,041 | 12/1941 | Hipple, Jr. | 336/185 |
| 3,466,499 | 9/1969 | Beth | 335/216 X |
| 3,493,904 | 2/1970 | Favereau | 335/216 |
| 3,515,979 | 6/1970 | Golay et al. | 336/220 X |
| 3,671,902 | 6/1972 | Westendorp | 335/216 X |
| 3,768,054 | 10/1973 | Neugebauer | 335/304 |
| 4,231,008 | 10/1980 | Krueger | 335/216 X |
| 4,320,342 | 3/1982 | Heinzerling | 324/320 X |
| 4,339,718 | 7/1982 | Bull et al. | 324/320 X |

Primary Examiner—George Harris
Attorney, Agent, or Firm—Flehr, Hohbach, Test, Albritton & Herbert

[57] ABSTRACT

Magnetic shielding of a magnet such as a first set of superconducting coils as used in nuclear magnetic resonance (NMR) applications includes a second set of coils around and spaced from the first set of coils. The magnetic flux of the second set of coils opposes and offsets the magnetic flux of the first set of coils in the region outside of the second set of coils but is less than the magnetic flux of the first set of coils in the region within the first set of coils. The uniformity of the magnetic flux within the first set of coils is not adversely affected by the magnetic flux produced by the second set of coils. In a preferred embodiment the coils of the first set are independently energized to establish a uniform field within the coils having suppressed lower order derivatives of flux with respect to position within the uniform field. The external field of the first set of coils comprises a dipole which is offset by the field of the second set of coils. Higher order multipoles beyond the dipole are also suppressed by the geometries of the two sets of coils.

16 Claims, 5 Drawing Figures

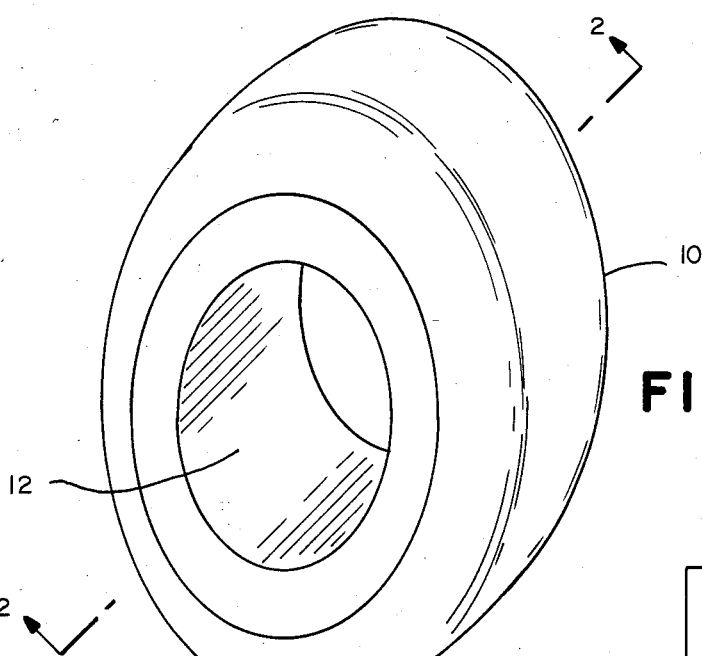
FIG.—1
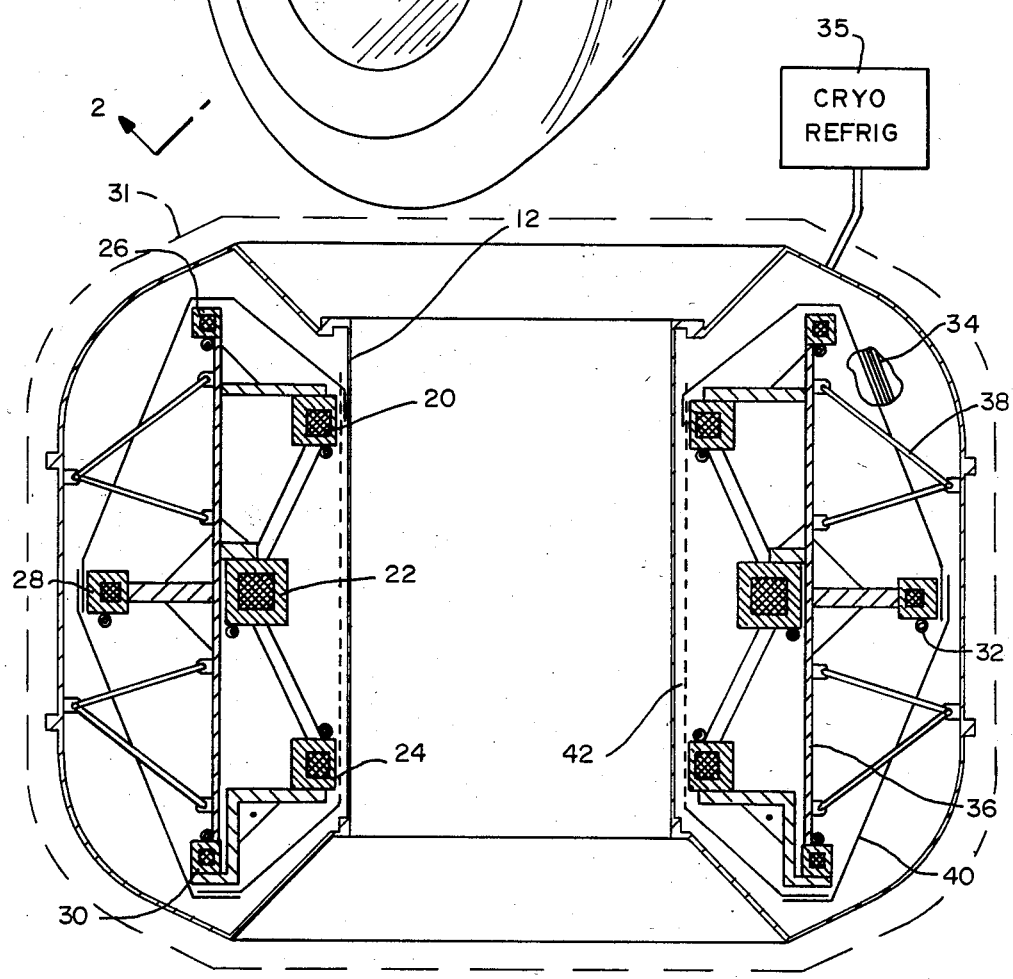
FIG.—2

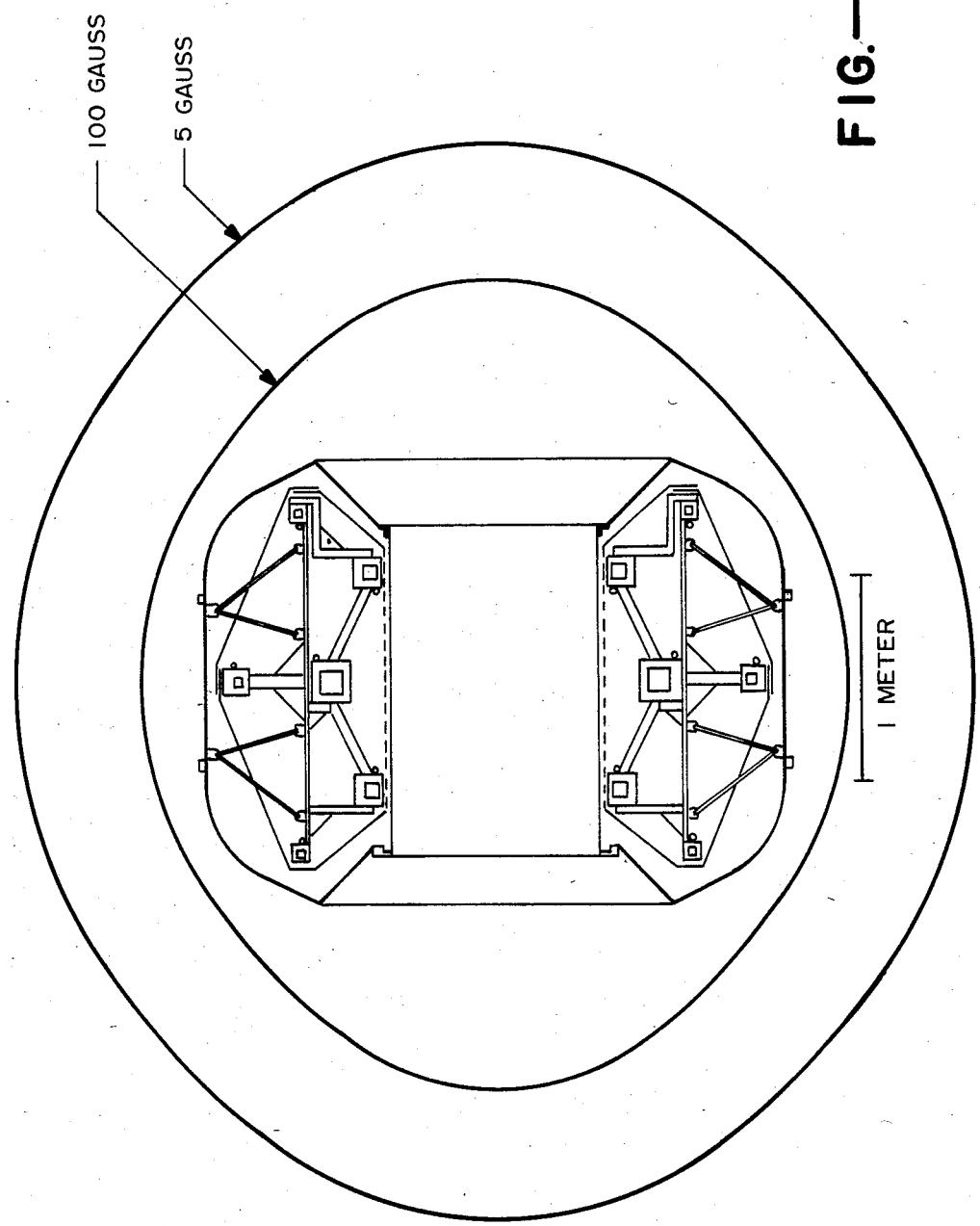

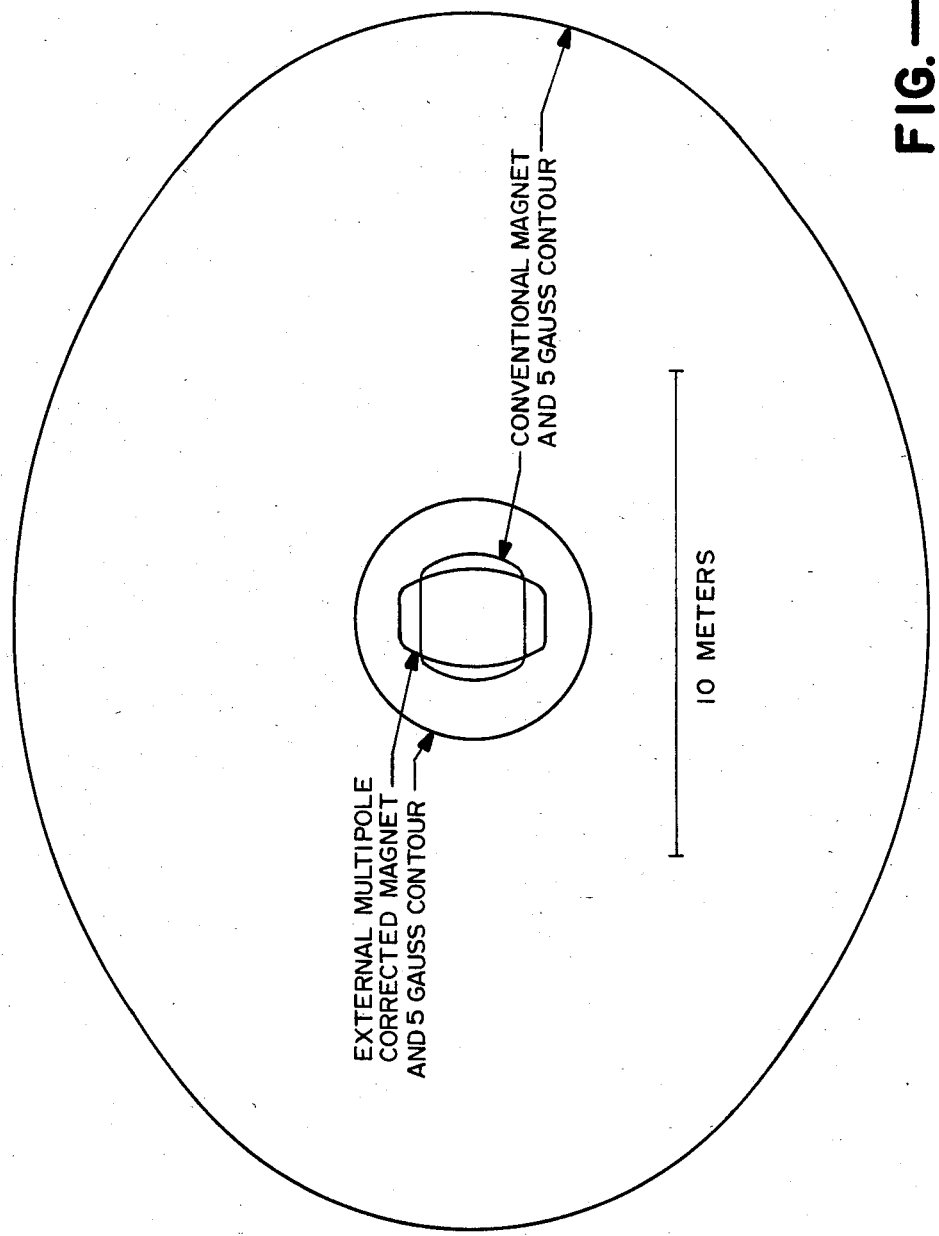
FIG.—4

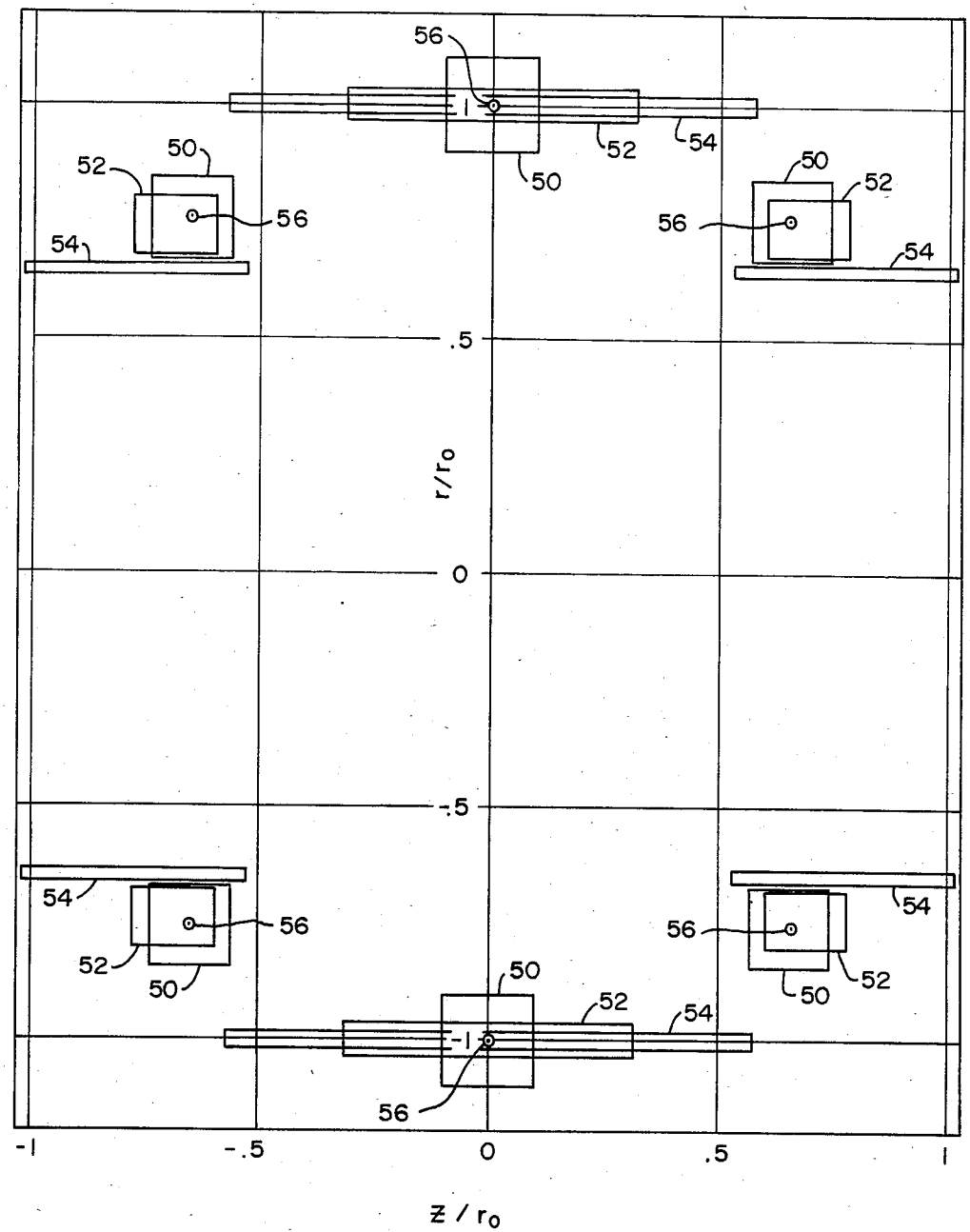
FIG.—5

MAGNETIC STRUCTURE FOR NMR APPLICATIONS AND THE LIKE

This is a continuation of application Ser. No. 628,452 filed July 6, 1984.

This invention relates generally to magnetic structures, and more particularly the invention relates to magnetic structures for use in nuclear magnetic resonance (NMR) applications and the like.

NMR, sometimes referred to as magnetic resonance imaging (MRI), is a new technology which can be used to produce two-dimensional slices of the human body on the video screen. The technology offers an advantage over the commercially available computed tomography (CT) scanners which require exposure of the patient to ionizing radiation. Further, NMR can be employed to observe many different types of atoms and identify the chemical environment of each atom.

NMR uses a strong magnetic field to line up atoms whose nuclei have an odd number of protons. A second RF magnetic field, usually applied at right angles to the first, is used to pump energy into these nuclei, flipping them over. When the applied magnetic field is removed, the nuclei flip back and give up the energy in the form of weak but detectable electromagnetic waves. These signals are used by a computer to produce images.

NMR images can be formed with protons in magnetic fields of only a few kilogauss. However, NMR information from other nuclei, such as fluourine and phosphorous requires fields of a few Tesla. Indeed, even with protons there are many advantages to using magnetic fields of one to two Tesla. On the other hand, strong magnetic fields outside of the viewing area can present a danger to humans not only from possible deleterious biological effects but also from ferromagnetic objects which are subject to powerful magnetic forces in the field gradient.

Standard practice has been to produce the necessary uniform fields with either end-corrected solenoids or with a number (typically four) of coils distributed along the axis of symmetry of the system. The field uniformity is determined by the geometry of the system and the relative currents in the various coils or windings, while the field magnitude is determined by the magnitude of the currents. In these systems, all of the different components produce magnetic fields in the same direction, and far from the windings the magnetic field necessarily looks as though it was produced by a dipole. The field thus decreases as the cube of the distance from the magnet.

Heretofore, shielding of the magnetic field outside the region of interest has been handled in two ways. Access to the region where the field is above a nominal five gauss limit can be restricted by various means, or the field can be contained through the use of ferromagnetic shielding. For a two Tesla whole body magnet the field drops to 5 gauss only at a distance of 30 or 40 feet from the magnet. Access to this region must be restricted from all sides, and from the top and bottom. The use of iron to shield the outside world from the magnet is difficult and expensive because of the amount of iron necessary. For a reasonably sized room the weight of the iron amounts to many tons. Further, in addition to the building structure having to be able to support the weight of the iron, the forces between the iron shielding and the magnet have to be carefully considered.

The use of a second magnetic field to offset a first magnetic field is heretofore known. See U.S. Pat. Nos. 3,493,904, 3,671,902, and 3,466,499. However, these applications are unrelated to NMR applications and do not encounter the constraints found in NMR applications. The U.S. Pat. No. '904 patent discloses a structure for generating a uniform magnetic field within a spherical volume by employing a single surface winding having contiguous turns over the spherical surface except at the axis of generation. Small access channels are provided at the vicinity of the axis. A shield winding is provided on a concentric spherical surface with the two windings connected in series and in magnetic opposition. The U.S. Pat. No. '902 patent discloses a shield for a single superconductive coil which comprises a plurality of conductive coils which surround the superconductive coil both laterally and longitudinally. The U.S. Pat. No. '499 patent discloses a shield for an elongated cylindrical conductor comprising a second, elongated cylindrical conductor coaxial with the first conductor. The second conductor accommodates a current sheet having a direction and magnitude to produce a field which squashes the field produced by the inner current sheet. None of these disclosures is relevant to NMR applications.

In accordance with the present invention reduced external fields are realized in a NMR magnetic structure while maintaining a uniformity of magnetic field in the NMR inspection area. A magnetic structure in accordance with the invention employs a first plurality of coils provided about a volume for producing a first uniform magnetic field through the volume. Importantly, the coil geometry is chosen so that when the currents in the coils are set to eliminate various orders of derivatives of flux with respect to position in the center of the volume, corresponding multipole moments of the field outside of the coil region are simultaneously eliminated. A uniform field inside the coils corresponds to an external field which decreases as the cube of the distance from the coils (a dipole field), while in general a component of the field in the center which varies as the nth power of the position at the center corresponds to a field which decreases as the (n+3) power of the distance from the center. Thus, when the currents in the first plurality of coils are set to produce a very uniform field in the center, the external field is that of a very pure dipole.

A second plurality of coils is provided about the first set of coils. The properties of the second set are similar to the first set in that there is a correspondence between the derivatives of the field produced by the second set in their center and the external multipoles produced by this set. The second set of coils may differ in number and angular placement from the first set of coils. Accordingly, the second set of coils can be used to produce a very uniform field in their center and a very pure dipole outside their volume.

In accordance with one aspect of the present invention, the dipole field produced by the second set of coils is adjusted to cancel or to substantially reduce the dipole field produced by the first set of coils. The remaining external fields are greatly reduced in magnitude and decrease with a very high power of the distance from the coils. The total magnetic field within the first set of coils remains highly homogeneous, and is only slightly reduced by the field of the second set of coils.

Preferably, the first coil means comprises a first plurality of superconducting coils and the second coil means comprises a second plurality of superconducting coils. Means is provided for generating currents in the first and second coils of magnitude and direction whereby the dipole magnetic field outside of the second coil is cancelled or substantially reduced. By effectively shielding a magnetic structure in accordance with the invention, the volume to which access must be restricted is reduced enormously as is the amount and weight of iron required to shield the remaining field, if desired. Moreover, the uniform magnetic field through the volume is enhanced by eliminating the lower order derivatives of flux.

Accordingly an object of the present invention is an improved magnetic structure for use with NMR imaging systems.

Another object of the invention is a magnetic structure which produces a strong and uniform magnetic field within a confined area but which is effectively shielded outside of the area.

Yet another object of the invention is an improved magnetic structure for NMR applications in which the magnetic field outside of the structure falls off rapidly while the magnetic flux within the imaging area remains uniform.

A feature of the invention is the use of a second set of coils about a first set of coils for producing an opposing dipole magnetic field which tends to cancel the dipole magnetic field of the first set of coils in areas outside of the second set of coils.

Another feature of the invention is the use of a first set of coils which can be individually energized to produce a magnetic field in a volume within the coils having no lower order derivatives of magnetic flux with position within the volume with position at the center of the volume and simultaneously to produce a magnetic field outside the coils which is that of a nearly perfect dipole.

The invention and objects and features thereof will be more readily understood from the following detailed description and appended claims when taken with the drawing, in which:

FIG. 1 is a perspective view of a magnetic structure in accordance with one embodiment of the invention.

FIG. 2 is a section view of the magnetic structure of FIG. 1 taken along the line 2—2.

FIG. 3 illustrates the magnetic shielding available with the magnetic structure of FIG. 2.

FIG. 4 illustrates the external field of the invention and the external field of a conventional magnet.

FIG. 5 is section view of sets of coils showing coil locations for different coil cross-sections.

Referring now to the drawing, FIG. 1 is a perspective view of the outside of a magnet structure for use in NMR imaging in accordance with the present invention. Conventionally, the magnet structure comprises a generally spherical vacuum housing 10 having a cylindrical opening 12 therethrough for receiving a patient and couch for imaging purposes. As above described, the magnet must be of sufficient strength to generate a uniform magnetic field within the opening 12 on the order of one to two Tesla. The magnetic structure appears as a dipole outside of the housing, and because of the field strength dangerously high magnetic fields exist up to distances many feet from the housing 10. Shielding required to make the magnetic structure useful in an ordinary hospital space, for example, would be prohibitive in weight.

FIG. 2 is a section view of the magnetic structure of FIG. 1 taken along the line 2—2 and illustrates one embodiment of magnetic structure in accordance with the present invention which minimizes external magnetic fields without requiring the excess magnetic shielding. A first coil means comprising a first set of coils 20, 22, and 24 surround the cylindrical opening 12 and define a first strong and uniform magnetic field necessary within the cylindrical opening 12. The superconducting coils are supported by suitable supports as shown. Positioned about the first set of coils 20–24 and spaced therefrom is a second plurality of coils 26, 28, and 30. The second set of coils is energized by a current having a direction to generate a second magnetic field in opposition to the magnetic field generated by the first set of coils 20–24. The magnitude of the second magnetic field is established to cancel the dipole moment of the first magnetic field outside of the magnetic structure. However, the second field is substantially less than the first magnetic field within the opening 12, and the field within the opening remains uniform. The magnitude of the field within the opening is established by the currents through the two sets of coils. To further enhance the magnetic shielding a ferromagnetic shield 31 can be provided around the magnetic structure.

This arrangement of coil sets is the so-called Maxwell three-coil configuration. The inner three coils are on a sphere of 80 cm radius and the outer three are on a sphere of 125 cm radius. The current in the outer coils is adjusted to exactly cancel the external dipole (about 40% of the current in the inner coils) and the resultant central field is thereby reduced to about 74% of that produced by the inner coils alone. This central field varies as the sixth power and the external field as the inverse ninth power of the normalized radius. The following table illustrates the central field uniformity:

| CENTRAL FIELD UNIFORMITY | |
| --- | --- |
| Field Uniformity | Diameter of Volume |
| $1 \times 10^{-7}$ | 9 cm |
| $1 \times 10^{-6}$ | 13 cm |
| $1 \times 10^{-5}$ | 20 cm |
| $1 \times 10^{-4}$ | 29 cm |

The structure of FIG. 1 uses forced-low cooling from a dedicated refrigerator 35 that is part of the magnet installation. This refrigerator provides a stream of saturated liquid helium which flows in tubes or channels 32 in thermal contact with the superconducting windings. These channels may be integrated into the winding itself if necessary, and they may be run to areas of high local heat leak, such as support points. After passing through the magnet, the stream still saturated, returns to the refrigerator. The refrigerator also provides a flow of helium gas at 20° K. to cool shielding that intercepts the thermal radiation and conductions from room temperature. The heat load on this shielding is controlled by means of multi-layer insulation shown at 34. However, this insulation does not have to be of the highest performance. The shield cooling gas also returns to the refrigerator, near 60° K. The structure is within vacuum vessel 34. Structure 36 supports the coils along with fiberglas reinforced straps 38, thermal radiation shield 40 is positioned between the coils and the vessel 34. A non-conducting bore tube and coil-foil thermal radiation shield 42 is provided near the central opening of the magnet structure. The closed-cycle, a forced-flow cryogenic system allows enormous simplification of the magnet construction over systems employing pool-boiling.

FIG. 3 illustrates the total magnetic field outside of the magnetic structure in the presence of the opposing magnetic field. The magnetic field in the central region is 1.5 Tesla. From this drawing it is seen that the five gauss contour is confined to a distance within approximately 1-2 meters of the magnetic structure. Thus, the magnetic structure can be used with NMR imaging equipment in a typical hospital laboratory room. FIG. 4 compares the external field of the present structure with that of a conventional NMR imaging magnet. The internal field produced by either magnet is 1.5 Tesla.

The invention can be mathematically described with long solenoids although it must be emphasized that the use of solenoids does not offer the advantage of other systems to be discussed shortly. The field on the axis of a solenoid can be written as $$B(z) = B_o \frac{\sqrt{a^2 + L^2/4}}{L} \left[ \frac{L/2 - z}{\sqrt{(L/2 - z)^2 + a^2}} + \frac{L/2 + z}{\sqrt{(L/2 + z)^2 + a^2}} \right]$$

where z is the distance along the axis from the center of the solenoid, L is the length of the solenoid, a is its radius, and $B_o$ is the field at the center. It is straightforward to expand this expression in powers of 1/z to show that when z is large compared with L and a, $$B(z) = B_o \frac{\sqrt{a^2 + L^2/4}}{L} \left( \frac{a^2 L}{z^3} \right) + 0 \, (1/z^5).$$

Now, suppose we have two concentric solenoids, forming a symmetric system. For simplicity assume that the length of the solenoids are the same, and assume that they are long compared with their radii so that $(\simeq a^2 + L^2/4)/L \, L/2$.

Then if we adjust the currents in the solenoids so that $$B_{o1}a_1^2 + B_{o2}a_2^2 = 0,$$

we will have a system with no dipole field and the field at large z will fall off as $1/z^5$. The field in the center of the system will be $$B(0) = B_{o1} \left( 1 - \left( \frac{a_1}{a_2} \right)^2 \right).$$

The penalty which has to be paid for the reduced external field is an increase in the current in the coils in order to produce the same central fields as without the cancelling coils. With normal conducting coils this penalty may be quite severe, but with a superconducting system the gains are worth the increased winding weight and complexity.

Systems of coils located on the surface of spherical shells are even more interesting than the solenoidal example above. It is well known that the magnetic field produced by current flowing on a spherical shell is absolutely uniform inside the shell and is a perfect dipole outside the shell, if the current density varies as $\sin\alpha$, where $\alpha$ is the angle between the internal field and the vector to the shell.

The fact that the external field is a perfect dipole guarantees that the field outside the larger of the two concentric spherical shells is identically zero, as long as the ratio of the current densities on the two shells is adjusted to cancel the dipoles. The field inside the smaller shell will be somewhat reduced, but it will still be absolutely uniform. To be specific, the 'z' component of the field inside a shell is proportional to I/a, while the outside is proportional to I/a $(a/z)^3$. If there are two shells, then $$I_1 a_1^2 + I_2 a_2^2 = 0$$

sets the external field to zero. The field inside the smaller shell is then $$B_i = B_1 \left( 1 \left( -\frac{a_1}{a_2} \right) \right)^3$$

where $B_1$ is the field produced by the inner shell alone.

While the field produced by the two concentric shells is ideal from some point of view, the configuration usually won't be very practical. The problem, of course, is access to the uniform field region. While access could be attained by arranging for the shells to be opened temporarily along $\alpha$ constant planes, fields produced by discrete planar coils providing inherent accessibility should be superior for many purposes.

To this end, consider a single spherical shell with a finite number of coils, wound at discrete angles i on the surface of the shell. This, of course, sets the planes of the various coils parallel to each other. Considering the direction perpendicular to these planes as the 'z' axis, it can be shown that the magnetic field generated by the 'i'th coil along the axis is given by:

$$B_{zi} = \frac{\mu I_i \sin \alpha_i}{2a} \sum_{n=1}^{\infty} \left( \frac{z}{a} \right)^{n-1} P_n^1 (\cos \alpha_i) \quad z \leq a$$

or $$B_{zi} = \frac{\mu I_i \sin \alpha_i}{2a} \sum_{n=1}^{\infty} \left( \frac{a}{z} \right)^{n+2} P_n^1 (\cos \alpha_i) \quad z \geq a.$$

In these equations, $I_i$ and $\alpha_i$ refer to the current and the coordinate of the ith coil located on the spherical shell of radius a. $P_n^1(x)$ is the associated Legendre polynominal in standard notation, and z is the distance along the axis from the center of the sphere. Note that the diameter of the coil is given by a $\sin \alpha_i$.

The total field produced by a set of coils can be obtained by adding the contribution of the individual coils as given in equations 7 and 8. It can now be seen that if the $\alpha_i$ and $I_i$ of a set of coils is chosen so that the coefficient of any of the $z^{m-1}$ term is zero for the internal field, then the coefficient of the $z^{-(m+2)}$ term will also be zero.

To produce the most uniform field inside the sphere, the obvious procedure is to choose the $\alpha_i$ and $I_i$ to eliminate as many of the $z^{m-1}$ terms (for $m \neq 1$) as possible. (Depending on whether the desire is for maximally uniform field at z=o, or for maximum average uniformity over some specific region, or some other particular requirement, the details of the procedure will differ but the idea will not.) The presence of the m=1 term will give a uniform field inside and a dipole outside. Every $z^{m-1}$ term eliminated inside will automatically eliminate a $z^{-(m+2)}$ multipole term outside. Thus as the internal field becomes more uniform, the external field becomes a more perfect dipole.

As examples, consider a two coil system, and a three coil system. If the coils are placed and excited symmetrically about the z=0 plane ($\alpha=\pi/2$) then half the terms in the field expansion will automatically vanish. This symmetry will be assumed. For the two coil system we can write:

$$B_z = \frac{\mu_o I}{a} \sin \alpha \sum_{n \text{ odd}} \left(\frac{z}{a}\right)^{n-1} P_n^1 (\cos \alpha) \quad z \leq a.$$

Since $P_3^1 (\cos \alpha) = 3/2 \sin \alpha (5 \cos^2 \alpha - 1)$, if $\alpha$ is chosen so that $5 \cos^2 \alpha = 1$ then the $z^2$ term vanishes. The fields (on axis) inside and outside the sphere can then be written:

$$B_z = \frac{4}{5} \frac{\mu_o I}{a} \left(1 + \sqrt{5/4} \left(\frac{z}{a}\right)^4 P_5^1\left(\frac{1}{\sqrt{5}}\right) + 0 (z^6)\right) z < a$$

$$B_z = \frac{4}{5} \frac{\mu_o I}{a} \left(\frac{a}{z}\right)^3 \left(1 + \sqrt{5/4} \left(\frac{a}{z}\right)^4 P_5^1\left(\frac{1}{\sqrt{5}}\right) + 0(z^{-6})\right) z > a$$

As the radius of each coil is given by a sin $\alpha_2$ and the coil separation is given by 2a cos $\alpha$, the choice cos$^2$ $\alpha=1/5$ is just that for the coil radius to be the same as the separation. This geometry is familiar as the Helmholtz configuration.

For the three-coil system we write:

$$B_z = \frac{\mu_o}{2a} \sum_{n \text{ odd}} \left(\frac{z}{a}\right)^{n-1} (I_o \sin\alpha_o P_n^1(\cos\alpha_o) + 2I_1 \sin\alpha_1 P_n^1(\cos\alpha_1))$$

From the symmetry condition discussed earlier, $\alpha_o = \pi/2$. We now choose $I_o/I_1$ and $\alpha_1$ so that both the $z^2$ and the $z^4$ term vanish. The two conditions can be written ($P_5^1 (\cos \alpha) = 15/8 \sin \alpha (21 \cos^4 \alpha - 14 \cos^2 \alpha + 1)$) as $$-\frac{3}{2} I_o + 3 I_1 \sin^2 \alpha_1 (5 \cos^2 \alpha_1 - 1) = 0$$

$$\frac{15}{8} I_o + \frac{15}{4} I_1 \sin^2 \alpha_1 (21 \cos^4 \alpha_1 - 14 \cos^2 \alpha_1 + 1) = 0.$$

These are satisfied by $\cos^2\alpha_1 = 3/7$, $I_o = 64/49$ $T_1$. With these choices, $B_z$ can be written as:

$$B_z = \frac{15}{16} \frac{\mu_o I_o}{a} \left[1 + \frac{8}{15}\left(\frac{z}{a}\right)^6 \left(P_7^1 (0) + \frac{7}{8} P_7 (\cos \alpha_1)/\sin \alpha_1\right) + 0 (z^8)\right] z < a$$

$$B_z = \frac{15}{16} \frac{\mu_o I_o}{a} \left(\frac{a}{z}\right)^3 \left[1 + \frac{8}{15}\left(\frac{a}{z}\right)^6 \left(P_7 (0) + \frac{7}{8} P_7^1 (\cos \alpha_1)/\sin \alpha_1\right) + 0 (z^{-8})\right] z > a$$

This three coil configuration, not as well known as the Helmholtz coils, is called the Maxwell geometry.

The purpose of these examples which are well known is to illustrate that the multipole components (other than the dipole) outside the sphere are reduced to zero at the same time that the spatial derivatives of B are reduced to zero inside the sphere.

In the usual coil arrangement the fact that the dipole field outside is becoming more and more perfect is rather irrelevant. The dipole field is large and carries a substantial amount of flux. The small perturbations in the dipole field at modes values of (a/z) are completely irrelevant to the field and shielding problem.

However, if two sets of coil geometries are used, but with different shell radii a, then the picture changes substantially. As discussed earlier, one set of coils can be used to cancel the dipole field of the other. In this case, the only fields outside the larger sphere are the higher order multipoles which decrease very rapidly as z increases.

As an illustration, consider two sets of the three coil geometry. Let the smaller set carry current $I_o$ in its center coil and have a radius of $a_o$. Let the larger coil set carry current $I_1$ and have radius $a_1$. The coils are concentric and coaxial, so the resulting field on axis can be written as:

$$B_z = \frac{15}{16} \mu_o \frac{I_o}{a_o} \left[1 + \frac{I_1}{I_o}\left(\frac{a_o}{a_1}\right) - \frac{143}{70}\left(\frac{z}{a_o}\right)^6 \left(1 + \frac{I_1}{I_o}\left(\frac{a_o}{a_1}\right)^7\right) + 0 (z^8)\right] z < a$$

$$B_z = \frac{15}{16} \mu_o \frac{I_o}{a_o}\left(\frac{a_o}{z}\right)^3 \left[\left(1 + \frac{I_1}{I_o}\left(\frac{a_1}{a_o}\right)^2\right) - \frac{143}{70}\left(\frac{a_o}{z}\right)^6 \left(1 + \frac{I_1}{I_o}\left(\frac{a_1}{a_o}\right)^8\right) + 0 (z^{-8})\right] z > a$$

Now choose $I_1/I_o (a_1/a_o)^2 = -1$ so that the dipole term is zero. The expressions become $$B_z =$$

$$\frac{15}{16} \mu_o \frac{I_o}{a_o}\left[\left(1 - \left(\frac{a_o}{a_1}\right)^3\right) - \frac{143}{70}\left(\frac{z}{a_o}\right)^6 \left(1 - \left(\frac{a_o}{a_1}\right)^9\right) + 0(z^8)\right] z < a.$$

-continued $$B_z = \frac{15}{16} \cdot \frac{143}{70} \mu_o \frac{I_o}{a_o} \left(\frac{a_o}{z}\right)^9 \left[\left(\left(\frac{a_1}{a_o}\right)^6 - 1\right) + 0(z^{-2})\right] z > a.$$

It is seen that the inner field is reduced by the factor $1-(a_o/a_1)^3$ from its value without the field due to the outer sphere. However, the field outside now changes very rapidly, as intended.

As a specific example, assume that the outer coils are on a radius of 125 cm and the inner coils are on a radius of 80 cm. The inner field is then approximately 74% of its uncompensated value. However, if the inner field is maintained at a value of 1.5 Telsa, the external field has dropped to 5 gauss at a distance of 2.8 meters. If the dipole term weren't cancelled, this distance would have to be 11.5 meters. The equations also show that the uniformity of the field in the central region is excellent, even though the field falls off so rapidly outside. In the example, the field varies by only a part in $10^7$ over a volume 9 cm in diameter or by a part in $10^6$ over a volume of 13 cm in diameter.

The excellent field uniformity of the magnets will not be preserved in the presence of nearby ferromagnetic material or other sources of magnetic fields. This problem is, of course, not unique to the particular winding geometry discussed here. It is typically solved through the use of correction windings to null the offending fields and gradients. It is also necessary that the external sources be constant in time and position, and that they not be too close. Since many such sources are not easily controlled (cars, trucks, elevators, tool carts, etc.), it is frequently necessary to surround the room containing the uniform field magnet with ferromagnetic shielding. In the normal winding configuration this also reduces the field outside the shield to allowed levels.

The problem with the use of the ferromagnetic shield with conventional magnets is that the weight of the material required can be enormous. The self shielding magnets described here require much less material. The following simple model shows that the required material differs by a factor of 500 or more between the two magnets.

Assume that the field outside some magnet falls off as $1/r^n$. The field can then be written as $B = B_s(a_s/r)^n$, where $B_s$ is the average field over the surface of a sphere of radius $d_s$ outside the magnet. The flux which has to return outside the radius $a_s$ is $$\phi_n \simeq \S B \cdot dA = \frac{2\pi}{n-2} B_n a_n^2 \ (n > 2).$$

This flux must be returned inside the shielding material, and through the requirement that it not be saturated sets its minimum thickness.

To illustrate the requirements, compare the 6 coil self shielded magnet discussed earlier with the 3 coil conventional magnet. Assume a spherical shield with 3 meter radius and assume that the central field is 1.5 Telsa.

Interestingly, in the model being used, the weight of the shield for the conventional magnet is independent of the shield radius. The field at the shield radius will be approximately 3.8 gauss for one magnet and 280 gauss for the other, leading to a return flux of 31 gauss meter$^2$ and 16 kilogauss m$^2$ respectively. If the shielding material is assumed to saturate at 10 kg, then 31 cm$^2$, or 1.6 m$^2$ is required, for a thickness of 0.16 mm or 8.5 cm. If this is translated into the weight of an iron sphere of 3 meter radius and the indicated thickness, assuming a density of 7.5 gms/cm$^3$, the conventional magnet requires 80 tons, while the self shielding magnet requires only 300 lbs.

In addition to the weight of the shield, the forces between the shield and magnet need to be taken into account. These forces are proportional to the product of the magnitude of the field and the field gradient at the location of the shield. Although the gradient of the self shielded magnet's fields is larger than that of the conventional magnet, the magnitude of the fields is such that the forces in the self shielded case are only 1/2000 those of the conventional case, at the 3 meter point.

The calculations presented are based upon idealized coils consisting of filamentary current loops as approximations in some sense to an equally idealized current sheet on the surface of a sphere. Real systems will have to be made with coils of finite dimensions, and will require some modifications in some of the details of the preceding equations. Enough work has been done on numerical calculations using dimensions of realistic coils to show that the advantage of these ideas can be realized in practical designs for central fields of at least 2 Tesla. Further, in the described embodiment the coils are assumed to be on a spherical surface. However, the coils could be arranged on any generally spheroidal surface including an approximation thereof, the approximation being dependent on a number of factors including coil cross-section.

This is illustrated in the section views of several sets of internal coils having different coil cross-sections shown in FIG. 5.

The coils 50 form a first set in which the aspect ratio (height-to-width, h/w) is 1; the coils 52 form a second set in which the aspect ratio is 0.1; and the coils 54 form a set in which the aspect ratio is 0.03. The placement of the coils can be compared with the placement of ideal filament coils 56. The coil sets 50-54 were generated by computer simulation of seal coils based on the integration of the expression for magnetic field with respect to i for the real coil configurations and assuming a uniform current density in the coils. Attached hereto and incorporated by reference is a listing of the program which generated the simulated coils.

The discussion of the technique for cancellation of the external fields has concentrated on examples in which the desired field in the interior region of the coils is uniform. It should be clear, however, that the technique is perfectly adaptable to the production of rather arbitrary field configurations within the central region, while retaining the property of very low external fields. An example is the production of the uniform gradient fields required in NMR imaging. These fields are typically pulsed and have to be superimposed on the large uniform field. The induction of eddy currents in nearby conductors can be a serious problem. The use of the external field cancelling method being presented here can allow the gradient fields to be produced with greatly reduced problems due to the eddy currents.

Thus, while the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

SOURCE LISTING

```
5    REM   !INTEGER I,J,K,K1,K2,K3,K4,K5,M,N,VI
10   DIM C(9,31),U(9,31),V(9,15),R(9,15),IR(9,15),P(15),Q(15)
15   D$ =  CHR$ (4)
16   FF$ = CHR$ (12)
20   K1 = 6: REM   NO OF VERTICES
25   K2 = 7: REM     HIGHEST ORDER COMPUTED
27   K3 = K2 + 10
28   K4 = 4: REM   NO OF VARIABLES IN OPTIMIZATION
29   K5 = 0: REM   ITERATION FLAG
30   C1 = 1:C2 = 2:C3 = 3:C4 = 4:C5 = 5:C6 = 6:C7 = 7:C8 = 8
31   C9 = 1.2566371
33   FOR N = 0 TO K1
34   R(N,0) = 1:IR(N,0) = 1
35   NEXT N
50   GOTO 1000

1000   REM   MAIN PROGRAM
1010   GOSUB 800
1015   GOSUB 1550
1020   GOSUB 500
1030   GOSUB 600
1040   GOSUB 100
1070   GOSUB 700
1072 K5 = K5 + 1
1073   PRINT
1074   PRINT K5
1075   PRINT Q(3),P(3)
1076   PRINT Q(5),P(5)
1080   IF  PEEK ( - 16384) > 127 THEN  GOTO 1200
1085   GOSUB 1800
1090   GOSUB 1650
1100   GOSUB 1600
1110   GOTO 1015
1200   POKE  - 16368,0
1205 K2 = 11
1210   GOSUB 500
1220   GOSUB 600
1230   GOSUB 100
1240   GOSUB 700
1250   GOSUB 900
1260   END
```

PROGRAM COILFIND 6TH ORDER

SOURCE LISTING

```
100   REM   ITERATES SR200
110   FOR VI = 1 TO K1
120   GOSUB 200
130   NEXT VI
140   RETURN
200   REM : COMPUTES U AND V
205 U = CO(VI)
206 S = SI(VI)
210 C(VI,0) = 0
211 C(VI,1) = S * S * S
215   FOR N = 1 TO K3
```

```
220 IN = C1 / N
225 C(VI,N + 1) = (C2 + IN) * U * C(VI,N) - (C1 + IN) * C(VI,N - 1)
230  NEXT N
240 V(VI,0) = 0
250  FOR N = 1 TO K2
255 V(VI,N) = C(VI,N) + U * V(VI,N - 1)
260  NEXT N
270  FOR N = 1 TO K2
280 V(VI,N) = V(VI,N) / (N + 2)
285  NEXT N
290  IF U < .1 THEN  GOTO 325
300 U(VI,2) = 1
305  FOR N = 1 TO K2
310 U(VI,N + 2) = (U(VI,N + 1) - C(VI,N)) / U
315  NEXT N
320  GOTO 350
325 U(VI,K3 + 2) = C(VI,K3 + 1)
330  FOR N = K3 + 2 TO 3 STEP  - 1
335 U(VI,N - 1) = C(VI,N - 2) + U * U(VI,N)
340  NEXT N
350  FOR N = 2 TO K2
355 U(VI,N + 1) = U(VI,N + 1) / N
360  NEXT N
370  RETURN

500  REM    SETS UP POWERS OF R
510  FOR N = 1 TO K1
515 R(N,1) =  SQR (X(N) * X(N) + Z(N) * Z(N))
520 IR(N,1) = C1 / R(N,1)
530  FOR M = 2 TO K2 + 1
540 R(N,M) = R(N,M - 1) * R(N,1)
545 IR(N,M) = IR(N,M - 1) * IR(N,1)
550  NEXT M
560  NEXT N
570  RETURN
600  REM    FINDS SINE & COSINE
610  FOR N = 1 TO K1
615 CO(N) = Z(N) * IR(N,1)
620 SI(N) = X(N) * IR(N,1)
625  NEXT N
630  RETURN

700  REM   FIND P & Q
705 Q(1) = 0
710  FOR VI = 1 TO K1
715 Q(1) = SG(VI) * Z(VI) *  LOG (X(VI) + R(VI,1)) + Q(1)
718  NEXT VI
720  FOR N = 1 TO K2 - 2 STEP 2
721 Q(N + 2) = 0:P(N) = 0
722  FOR VI = 1 TO K1
725 Q(N + 2) = SG(VI) * IR(VI,N) * U(VI,N + 2) / N + Q(N + 2)
730 P(N) = SG(VI) * R(VI,N + 3) * V(VI,N + 1) / (N + 2) + P(N)
735  NEXT VI
740 Q(N + 2) = Q(N + 2) / Q(1)
745 P(N) = P(N) / Q(1)
750  NEXT N
754 Q1 = Q(1)
755 Q(1) = Q(1) * C9
760  RETURN
```

```
800  REM    INPUT ROUTINE
810  R0 = 1
815  HOME
817  PRINT "ENTER A VALUE FOR THE AREA OF THE CENTRAL COIL";
818  PRINT " AND A VALUE FOR ITS ASPECT RATIO: A,B"
819  PRINT
820   INPUT A,B
822  XA = .4375 *  SQR (A)
825  X4 = R0 +  SQR (A * B) / 2
826  X3 = R0 -  SQR (A * B) / 2
827  Z3 =  SQR (A / B) / 2
830  X1 = .7 - .5 * XA:X2 = .7 + .5 * XA
832  Z1 = .77 - 2 * XA:Z2 = .77 + 2 * XA
880  X1 = X1 / R0: REM   ENTRY POINT
881  X2 = X2 / R0
883  X3 = X3 / R0
884  X4 = X4 / R0
890  Z1 = Z1 / R0
891  Z2 = Z2 / R0
892  Z3 = Z3 / R0
899   RETURN
900  REM    OUTPUT ROUTINE
903  PRINT D$;"PR#1"
905  PRINT "                        PROGRAM COILFIND 6TH ORDER"
906  PRINT : PRINT : PRINT : PRINT
910  PRINT "R0 = ";R0
911  PRINT
915  PRINT "CENTRAL COIL ASPECT RATIO IS ";B;"  AND THE AREA IS ";A
916  PRINT
919  PRINT "CENTER OF SIDE COIL IS AT X = ";(X1 + X2) / 2;
920  PRINT ",   Z = ";(Z2 + Z1) / 2"
921  PRINT "ITS ASPECT RATIO IS ";(X2 - X1) / (Z2 - Z1)
922  PRINT "AND ITS AREA IS ";(X2 - X1) * (Z2 - Z1)
924  PRINT : PRINT
925  PRINT "VERTICES ARE:": PRINT
926  FOR N = 1 TO K1
927  PRINT "Z(";N;") = ";Z(N);
928  PRINT "     X(";N;") = ";X(N);
929  PRINT "     SG(";N;") = ";SG(N)
930  NEXT N
935  PRINT : PRINT
940  PRINT "N              Q(N)            P(N)"
941  PRINT
945  FOR N = 1 TO K2 STEP 2
946  PRINT N;
947  HTAB (8): PRINT Q(N);
949  IF P(N) = 0 THEN   GOTO 955
950  HTAB (26): PRINT P(N)
955  NEXT N
960  PRINT FF$
970  PRINT D$;"PR#0"
980   RETURN

1550  REM    SETS UP VERTICES
1555  Z(1) = Z1:X(1) = X1:SG(1) =  + 1
1556  Z(2) = Z1:X(2) = X2:SG(2) =  - 1
1557  Z(3) = Z2:X(3) = X1:SG(3) =  - 1
1558  Z(4) = Z2:X(4) = X2:SG(4) =  + 1
1559  Z(5) = Z3:X(5) = X3:SG(5) =  - 1
1560  Z(6) = Z3:X(6) = X4:SG(6) =  + 1
1565   RETURN
```

```
1600  REM   FINDS CORRECTED VARIABLES
1610  Z1 = Z1 + A(1,5)
1615  Z2 = Z2 + A(2,5)
1620  X1 = X1 + A(3,5)
1625  X2 = X2 + A(4,5)
1630  RETURN
1650  FOR J = 1 TO K4: REM   GAUSSIAN ELIMINATION ROUTINE**
1655   FOR I = J TO K4
1660   IF A(I,J) < > 0 THEN 1680
1665   NEXT I
1670   PRINT "NO UNIQUE SOLUTION"
1675   GOTO 1770
1680   FOR K = 1 TO K4 + 1
1685   X = A(J,K)
1690   A(J,K) = A(I,K)
1695   A(I,K) = X
1700   NEXT K
1705   Y = 1 / A(J,J)
1710   FOR K = 1 TO K4 + 1
1715   A(J,K) = Y * A(J,K)
1720   NEXT K
1725   FOR I = 1 TO K4
1730   IF I = J THEN 1755
1735   Y = - A(I,J)
1740   FOR K = 1 TO K4 + 1
1745   A(I,K) = A(I,K) + Y * A(J,K)
1750   NEXT K
1755   NEXT I
1760   NEXT J
1765   GOTO 1790
1770   FOR N = 2 TO K4
1775   A(N,K4 + 1) = 0
1780   NEXT N
1785   A(1,K4 + 1) = .001
1790   RETURN
1800   REM SET UP DERIVATIVE MATRIX
1810   FOR N = 1 TO K4
1815   FOR M = 1 TO K4
1820   A(N,M) = 0
1825   NEXT M
1830   NEXT N
1850   FOR VI = 1 TO 2
1851   A(1,1) = A(1,1) - SG(VI) * IR(VI,2) * U(VI,4) * C3 / C2
1852   A(2,1) = A(2,1) - SG(VI) * IR(VI,4) * U(VI,6) * C5 / C4
1853   A(3,1) = A(3,1) + SG(VI) * R(VI,5) * V(VI,3)
1854   A(4,1) = A(4,1) + SG(VI) * R(VI,7) * V(VI,5)
1855   NEXT VI
1860   FOR VI = 3 TO 4
1861   A(1,2) = A(1,2) - SG(VI) * IR(VI,2) * U(VI,4) * C3 / C2
1862   A(2,2) = A(2,2) - SG(VI) * IR(VI,4) * U(VI,6) * C5 / C4
1863   A(3,2) = A(3,2) + SG(VI) * R(VI,5) * V(VI,3)
1864   A(4,2) = A(4,2) + SG(VI) * R(VI,7) * V(VI,5)
1865   NEXT VI
1870   FOR VI = 1 TO 3 STEP 2
1871   A(1,3) = A(1,3) - SG(VI) * IR(VI,2) * C(VI,2) / (SI(VI) * C2)
1872   A(2,3) = A(2,3) - SG(VI) * IR(VI,4) * C(VI,4) / (SI(VI) * C4)
1873   A(3,3) = A(3,3) + SG(VI) * R(VI,5) * C(VI,4) / (SI(VI) * C5)
1874   A(4,3) = A(4,3) + SG(VI) * R(VI,7) * C(VI,6) / (SI(VI) * C7)
1875   NEXT VI
1880   FOR VI = 2 TO 4 STEP 2
1881   A(1,4) = A(1,4) - SG(VI) * IR(VI,2) * C(VI,2) / (SI(VI) * C2)
1882   A(2,4) = A(2,4) - SG(VI) * IR(VI,4) * C(VI,4) / (SI(VI) * C4)
```

```
1883 A(3,4) = A(3,4) + SG(VI) * R(VI,5) * C(VI,4) / (SI(VI) * C5)
1884 A(4,4) = A(4,4) + SG(VI) * R(VI,7) * C(VI,6) / (SI(VI) * C7)
1885 NEXT VI
1890 A(1,5) =  - Q(3) * Q1
1891 A(2,5) =  - Q(5) * Q1
1892 A(3,5) =  - P(3) * Q1
1893 A(4,5) =  - P(5) * Q1
1899 RETURN
```

RO = 1

CENTRAL COIL ASPECT RATIO IS .03   AND THE AREA IS .04

CENTER OF SIDE COIL IS AT X = .645621898,   Z = .779211728
ITS ASPECT RATIO IS .0520558501
AND ITS AREA IS .0127458146

VERTICES ARE:

| | | |
|---|---|---|
| $Z(1)$ = .531800713 | $X(1)$ = .632742707 | $SG(1)$ = 1 |
| $Z(2)$ = .531800713 | $X(2)$ = .658501089 | $SG(2)$ = -1 |
| $Z(3)$ = 1.02662274 | $X(3)$ = .632742707 | $SG(3)$ = -1 |
| $Z(4)$ = 1.02662274 | $X(4)$ = .658501089 | $SG(4)$ = 1 |
| $Z(5)$ = .577350269 | $X(5)$ = .982679492 | $SG(5)$ = -1 |
| $Z(6)$ = .577350269 | $X(6)$ = 1.01732051 | $SG(6)$ = 1 |

| N | Q(N) | P(N) |
|---|---|---|
| 1 | .0285870672 | 1.11282532 |
| 3 | -1.02348248E-08 | 4.47773585E-09 |
| 5 | -2.94251213E-08 | -2.5587062E-09 |
| 7 | -.921330441 | .295115339 |
| 9 | .452492394 | -2.6652556 |
| 11 | 1.32023592 | |

RO = 1

CENTRAL COIL ASPECT RATIO IS .1   AND THE AREA IS .04

CENTER OF SIDE COIL IS AT X = .737660779,   Z = .69248858
ITS ASPECT RATIO IS .745737183
AND ITS AREA IS .0231212523

VERTICES ARE:

| | | |
|---|---|---|
| $Z(1)$ = .604448023 | $X(1)$ = .672005662 | $SG(1)$ = 1 |
| $Z(2)$ = .604448023 | $X(2)$ = .803315896 | $SG(2)$ = -1 |
| $Z(3)$ = .780529137 | $X(3)$ = .672005662 | $SG(3)$ = -1 |
| $Z(4)$ = .780529137 | $X(4)$ = .803315896 | $SG(4)$ = 1 |
| $Z(5)$ = .316227766 | $X(5)$ = .968377223 | $SG(5)$ = -1 |
| $Z(6)$ = .316227766 | $X(6)$ = 1.03162278 | $SG(6)$ = 1 |

| N | Q(N) | P(N) |
|---|---|---|
| 1 | .039276634 | 1.04369859 |
| 3 | 7.44930496E-09 | -9.3116312E-10 |
| 5 | -7.44930496E-09 | 5.58697872E-09 |
| 7 | -1.42445419 | -1.63386157 |
| 9 | 1.19826774 | 1.07992205 |
| 11 | .986948933 | |

RO = 1

CENTRAL COIL ASPECT RATIO IS 1  AND THE AREA IS .04

CENTER OF SIDE COIL IS AT X = .755495393,   Z = .656010411
ITS ASPECT RATIO IS 1.01050473
AND ITS AREA IS .0305908758

VERTICES ARE:

Z(1) = .569014912      X(1) = .66758603      SG(1) = 1
Z(2) = .569014912      X(2) = .843404756     SG(2) = -1
Z(3) = .743005911      X(3) = .66758603      SG(3) = -1
Z(4) = .743005911      X(4) = .843404756     SG(4) = 1
Z(5) = .1    X(5) = .9    SG(5) = -1
Z(6) = .1    X(6) = 1.1   SG(6) = 1

| N | Q(N) | P(N) |
|---|---|---|
| 1 | .0470071889 | 1.00531431 |
| 3 | -3.50113021E-09 | -3.89014468E-10 |
| 5 | -2.13957957E-09 | 3.89014468E-09 |
| 7 | -2.02082251 | -2.07537826 |
| 9 | 2.83237154 | 2.93166543 |
| 11 | -.627416638 | |

CALCULATION AND OPTIMIZATION OF REALIZABLE COILS

AN EXAMPLE

To calculate the field produced by an array of coils of finite cross-sections it is necessary to sum contributions in the expressions on page 11, line 25, from each infinitesimal area of the coil cross-section. For this purpose these expressions can be generalized as follows:

For the regions inside the smallest current loop $$B_z = \frac{\mu i}{2r_o} \sum_{\mu=1}^{\infty} q_\mu \left(\frac{z}{r_o}\right)^{\mu-1}$$

and for the regions outside of the largest loop $$B_z = \frac{\mu i}{2r_o} \sum_{\mu=1}^{\infty} p_\mu \left(\frac{r_o}{z}\right)^{\mu+2}$$

where $$q_\mu = \iint \left(\frac{r_o}{r}\right)^\mu \sin \alpha \, P_\mu^1(\cos \alpha) \, dA$$

$$p_\mu = \iint \left(\frac{r}{r_o}\right)^{\mu+1} \sin \alpha \, P_\mu^1(\cos \alpha) \, dA$$

These integrals are carried out over the cross-sectional area of the coils of constant current density i. As before the position of the source loop is the spherical coordinate-system at the radius r and the angle $\alpha$. The axis of azimuthal symmetry is z. In the coaxial cylindrical coordinate system the source loop is at $z = r \cos \alpha$ and $x = r \sin \alpha$. The quantity $r_o$ is a scale factor.

For the case in which the coils are bounded by surfaces of constant z and surfaces of constant x, that is right circular cylindrical windings, the integrals for the p and q coefficients can be expressed in terms of the spatial functions defined by recursion relations in Table I. Further specializing the case of systems symmetry in z with all of the current in the same sense, the expressions in Table II for the p and q and in Table III for the derivatives of the p and q apply.

The summation in these expressions is carried over the various functions calculated at the corners, vertexes, of the coils. The variable SG takes the value ±1 depending on the type of vertex. Vertexes like $x_1$, $z_1$ and $x_2$, $z_2$ in illustration I are +1; others are −1. Inside corners take the opposite signs from similar outside corners. The summations in the expressions for the derivatives are carried over one pair of adjacent vertexes.

With a way of evaluating the p and q coefficients and their derivatives the way is open to use Newton's method to adjust the coil dimensions in order to make a selected group of the p and q take on chosen values. The attached computer program, coilfind 6th order, written in Basic, does this for a set of three coils in the Maxwell configuration. For a given center coil, the dimensions of the outer pair of coils are adjusted to make $p_3$, $p_5$, $q_3$, and $q_5$ all zero.

The flow of the program is as follows. The lines following line 800 ask for values for the area and shape of the central coil and set up starting values. The lines after line 1550 set up the coordinates of the vertexes and their signs. The routines following lines 500, 600, 700 and 100 calculate the special functions and the p and q values. A matrix of the chosen partial derivatives is set up by the routines at line 1800, the linear equations are solved by gaussian elimination by the routine after line 1650, and a new set of sides for the outer coil is found at line 1600. This whole process is then repeated until convergence is obtained, usually after fewer than 10 iterations.

Three cases calculated in this way are presented in Table IV and in FIG. 5 of the attached application. The fields for these systems can be found from the tabulated coefficients in the following way: Near the origin $$B_z = i r_0 q_1 \left(1 + q_7 \left(\frac{z}{r_o}\right)^6 + q_9 \left(\frac{z}{r_o}\right)^8\right) + 0\left(\frac{z}{r_o}\right)^{10}$$

and far from the origin $$B_z = i r_0 q_1 \left(p_1 \left(\frac{r_o}{z}\right) + p_7 \left(\frac{r_o}{z}\right)^9\right) + p_9 \left(\frac{r_o}{z}\right)^{10} + 0\left(\frac{r_o}{z}\right)^{13}$$

The units are Gaussian in that for example in case 1 the field at the origin for $r_o = 50$ cm. and $i = 10,000$ amps./cm$^2$ would be 23.5 Kilogauss.

Each one of these cases is a realizable system with all of the important properties of the three loop ideal system discussed in the attached application and following, and each can be combined in a dipole cancelling arrangement generally to give the central field uniformity described and the external field reduction illustrated in FIG. 3.

Reference M. W. Garrett, J. Appl. Phy. 22, 1091 (1951)

TABLE I
Special Functions for Cylindrical Coils

Functions C
$C_1 = \sin^3 \alpha$
$\mu C_{\mu+1} = (2\mu + 1) \cdot \cos \alpha \cdot C_\mu - (\mu + 1) C_\mu$ Functions U
$U_2 = 1$ $(\mu + 1) u_{\mu+2} = \frac{1}{\cos \alpha} (\mu U_{\mu+1} - C_\mu)$ $\left(\text{For } \cos \alpha = 0, U_\mu = \frac{1}{\mu - 1} C_{\mu-1}. \text{ For small } \cos \alpha \text{ the } U \text{ can be found by descending recursions}\right)$ Functions V
$V_1 = \frac{1}{3} C_1$
$(\mu + 2) V_\mu = C_\mu + (\mu + 1) \cdot \cos \alpha \cdot V_{\mu-1}$

TABLE II
P and Q coefficients for symmetric cylindrical coil system $$q_1 = 2 r_o^2 \sum_j SG_j \frac{r_j}{r_o} \cdot \cos \alpha_j \log \left(\frac{x_j + r_j}{r_o}\right)$$

$$q_{\mu+2} = \frac{2 r_o^2}{\mu} \sum_j SG_j \left(\frac{r_o}{r_j}\right)^\mu (U_{\mu+2})_j$$

$q_\mu = 0$ for even $\mu$ $$p_\mu = \frac{2 r_o^2}{\mu + 2} \sum_j SG_j \left(\frac{r_j}{r_o}\right)^{\mu+3} (V_{\mu+1})_j$$

$p_\mu = 0$ for even $\mu$
Summation carried over every vertex in first quadrant of z-x plane.

TABLE III
Derivatives of P & Q coefficients for symmetric, cylindrical coil system $$\frac{\partial q_\mu}{\partial z/r_o} = -\frac{2 r_o^2 \mu}{(\mu - 1)} \sum_j SG_j \left(\frac{r_j}{r_o}\right)^{-(\mu-1)} (U_{\mu+1})_j$$

$$\frac{\partial q_\mu}{\partial x/r_o} = -\frac{2 r_o^2}{(\mu - 1)} \sum_j SG_j \left(\frac{r_j}{r_o}\right)^{-(\mu-1)} \frac{(C_{\mu-1})_j}{\sin \alpha_j}$$

$$\frac{\partial p_\mu}{\partial z/r_o} = 2 r_o^2 \sum_j SG_j \left(\frac{r_j}{r_o}\right)^{\mu+2} (V_\mu)_j$$

$$\frac{\partial p_\mu}{\partial x/r_o} = \frac{2 r_o^2}{(\mu + 2)} \sum_j \left(\frac{r_j}{r_o}\right)^{\mu+2} \frac{(C_{\mu+1})_j}{\sin \alpha_j}$$

Summation carried over one pair of vertices only.

TABLE IV

| | | CASE 1 | CASE 2 | CASE 3 |
|---|---|---|---|---|
| Center Coil | Center z | 0 | 0 | 0 |
| | x | 1 | 1 | 1 |
| | Area | .04 | .04 | .04 |
| | Aspect Ratio | 1 | .1 | .03 |
| Side Coil | Center z | .6560 | .6925 | .7792 |
| | x | .7555 | .7377 | .6456 |
| | Area | .0306 | .0231 | .01275 |
| | Aspect Ratio | 1.0104 | .7457 | .0521 |
| Normalized Values | $q_1$ | .04700 | .03928 | .02859 |
| | $q_3$ | 0 | 0 | 0 |
| | $q_5$ | 0 | 0 | 0 |
| Gaussian Units | $q_7$ | −2.0208 | −1.4245 | −.92133 |
| | $q_9$ | 2.8324 | 1.1983 | .45249 |
| | $p_1$ | 1.0053 | 1.0437 | 1.1128 |
| | $p_3$ | 0 | 0 | 0 |
| | $p_5$ | 0 | 0 | 0 |
| | $p_7$ | −2.0754 | −1.6339 | .29511 |
| | $p_9$ | 2.9317 | 1.0799 | −2.6652 |

What is claimed is:

1. A magnetic structure useful in NMR applications comprising
  a first set of coils provided about a volume and independently energized to establish a field with suppressed lower order derivatives of flux through said volume and a dipole with higher order magnetic moments outside of said first set of coils, and
  a second set of coils provided about the first set of coils and independently energized for producing a magnetic field which opposes said dipole of said first set of coils while not substantially affecting the uniformity of said field through said volume.

2. The magnetic structure as defined by claim 1 wherein said first and second sets of coils are configured and energized to suppress lower orders of derivatives of flux within said first and second sets of coils and to suppress corresponding multipole moments of the magnetic flux outside of said second set of coils.

3. The magnetic structure as defined by claim 1 wherein said structure includes openings for receiving a patient.

4. The magnetic structure as defined by claim 2 wherein said first and second sets of coils suppress multipole moments outside of said structure.

5. The magnetic structure as defined by claim 2 wherein said first set of coils and said second set of coils are arranged on generally spheroidal surfaces.

6. The magnetic structure as defined by claim 5 and further including a ferromagnetic shield provided about said second set of coils.

7. The magnetic structure as defined by claim 1 wherein said first set of coils and said second set of coils comprise superconducting coils.

8. The magnetic structure as defined by claim 1 wherein said magnetic field through said volume includes a non-uniform component.

9. A magnetic structure for NMR imaging comprising
   a first set of coils arranged to define a first spheroidal surface having two opposing openings for receiving a patient for imaging, each coil of said first set of coils being independently energizable to establish a uniform field within said first spheroidal surface and a dipole outside of said first spheroidal surface, and
   a second set of coils arranged to define a second spheroidal surface having two opposing openings for receiving a patient for imaging, said second spheroidal surface being concentric with and outside of said first spheroidal surface, each coil of said second set of coils being independently energizable to establish a field outside of said second spheroidal surface which offsets said dipole of said first set of coils while not significantly affecting the uniformity of said field within said first spheroidal surface.

10. A magnetic structure useful in NMR applications comprising
    a first set of coils provided about a first spheroidal surface,
    a second set of coils provided about a second spheroidal surface, said second spheroidal surface being generally concentric with and spaced around said first spheroidal surface,
    said first set of coils and said second set of coils being cooperatively and independently energizable to produce a magnetic field within said first spheroidal surface of a desired geometry and to produce at least one opposing component of a magnetic field outside of said second spheroidal surface.

11. The magnetic structure as defined by claim 10 wherein said desired geometry within said first spheroidal surface is a uniform field having suppressed orders of derivatives of flux and simultaneously suppressed multipole moments outside of said second spheroidal surface, said suppressed multipole moments corresponding to said suppressed orders of derivatives.

12. The magnetic structure as defined by claim 11 wherein said first set of coils and said second set of coils produce opposing dipoles outside of said second spheroidal surface.

13. A method of effectively shielding a magnetic structure for use in NMR imaging comprising the steps of
    providing a first set of coils which define a first spheroidal surface,
    energizing each of said first set of coils to establish a uniform magnetic field within said first spheroidal surface and a dipole outside of said first spheroidal surface,
    providing a second set of coils which define a second spheroidal surface concentric with and outside of said first spheroidal surface, and
    energizing each of said second set of coils to establish a magnetic field outside of said second spheroidal surface which offsets said dipole while not significantly affecting the uniformity of said magnetic field within said first spheroidal surface.

14. The method as defined by claim 13 wherein each coil of said first set of coils is independently energized to suppress lower order derivatives of flux with respect to position within said uniform magnetic field and simultaneously suppress lower order magnetic moments outside of said first spheroidal surface.

15. A method of generating a magnetic field of a desired configuration within a volume and simultaneously producing a magnetic field of reduced magnitude outside of said volume, said method comprising the steps of
    providing a first set of coils on a first spheroidal surface around said volume,
    providing a second set of coils on a second spheroidal surface generally concentric with said first spheroidal surface and spaced around said first spheroidal surface,
    independently energizing said first set of coils and said second set of coils to produce said magnetic field of desired configuration within said volume and to produce at least one opposing component of a magnetic field outside of said volume.

16. The method as defined by claim 15 wherein said desired geometry within said first spheroidal surface is a uniform field having suppressed orders of derivatives of flux and simultaneously suppressed multipole moments outside of said second spheroidal surface, said suppressed multipole moments corresponding to said suppressed orders of derivatives.

* * * * *